US009960780B1

(12) United States Patent
Venkataraman et al.

(10) Patent No.: US 9,960,780 B1
(45) Date of Patent: May 1, 2018

(54) CURRENT SOURCE NOISE CANCELLATION

(71) Applicant: TEXAS INSTRUMENTS INCORPORATED, Dallas, TX (US)

(72) Inventors: Jagannathan Venkataraman, Bangalore (IN); Eeshan Miglani, Chhindwara (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/649,262

(22) Filed: Jul. 13, 2017

Related U.S. Application Data

(60) Provisional application No. 62/440,769, filed on Dec. 30, 2016.

(51) Int. Cl.
*H03M 1/06* (2006.01)
*H03M 1/08* (2006.01)
*H03K 17/16* (2006.01)

(52) U.S. Cl.
CPC ............ *H03M 1/08* (2013.01); *H03K 17/162* (2013.01)

(58) Field of Classification Search
CPC .............................. H03M 1/08; H03K 17/162
USPC .................................................. 341/118, 143
See application file for complete search history.

(56) References Cited

U.S. PATENT DOCUMENTS

| 8,179,186 | B2* | 5/2012 | Flewelling | ........... | H03K 19/001 |
| | | | | | 327/365 |
| 8,466,668 | B2* | 6/2013 | Cross | ....................... | H02M 1/36 |
| | | | | | 323/282 |
| 9,614,530 | B2* | 4/2017 | Jaffari | .............. | H03K 19/01852 |
| 9,667,194 | B2* | 5/2017 | Lee | ....................... | H03F 1/0205 |

* cited by examiner

*Primary Examiner* — Brian Young
(74) *Attorney, Agent, or Firm* — John R. Pessetto; Charles A. Brill; Frank D. Cimino

(57) ABSTRACT

At least some embodiments are directed to a system that comprises a differential switch network comprising first and second output nodes, first and second transistors coupled to the network, and first and second resistors coupled to the first and second transistors. The DAC also comprises a voltage source coupled to the first resistor and a ground connection coupled to the second resistor. The DAC further includes a capacitor coupled to the first and second transistors and to the second resistor.

19 Claims, 4 Drawing Sheets

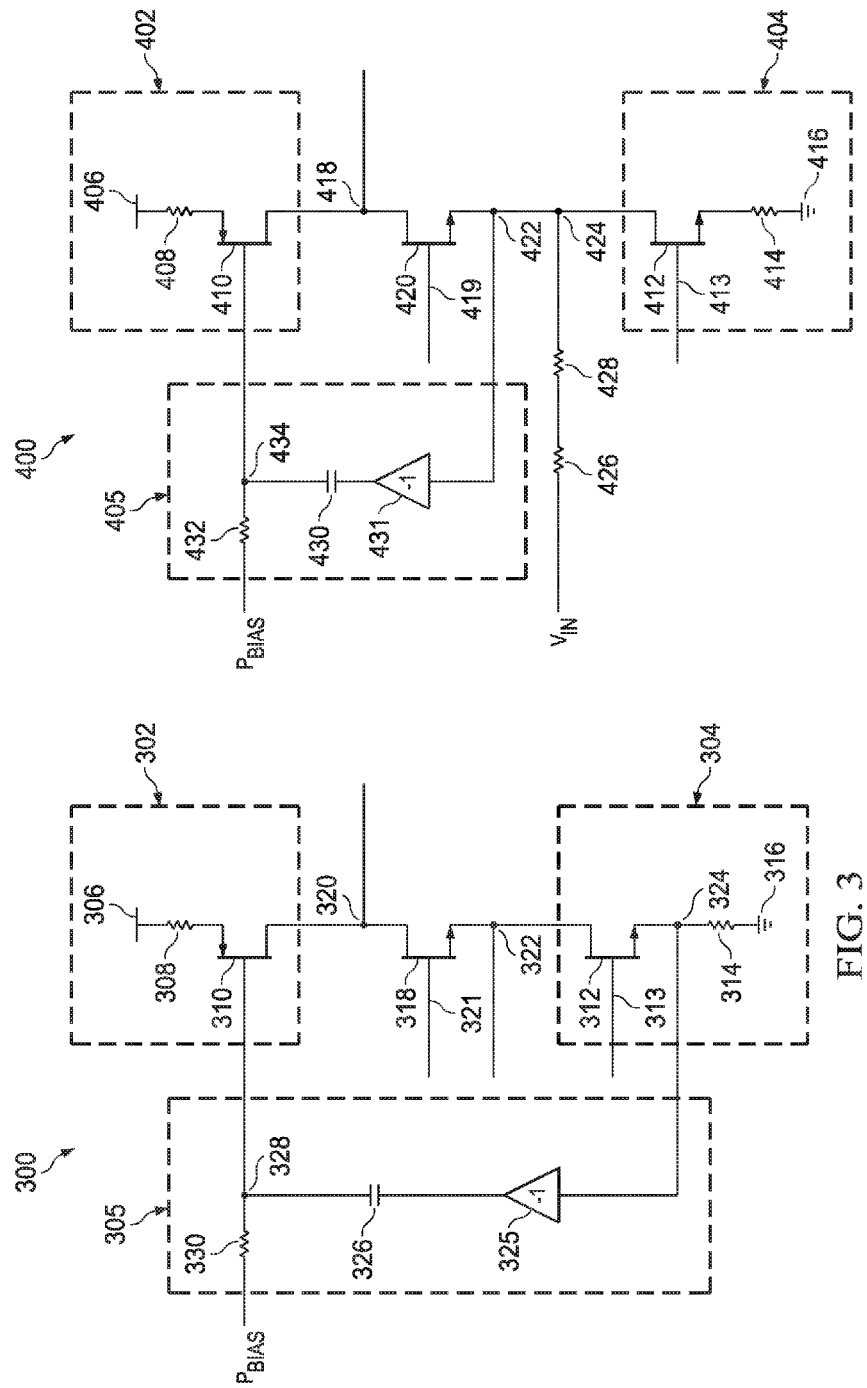

CURRENT SOURCE NOISE CANCELLATION

CROSS-REFERENCE TO RELATED APPLICATIONS

The present application claims priority to U.S. Provisional Patent Application No. 62/440,769, which was filed on Dec. 30, 2016, is titled "Current Source Noise Cancellation," and is hereby incorporated herein by reference in its entirety.

BACKGROUND

Various electrical components, such as current buffers and digital-to-analog converters (DACs), contain current sources. These current sources often contain transistors that regulate the flow of current out of the current sources. In many cases, these transistors undesirably introduce noise to the currents—for instance, flicker noise caused by transistors conducting low frequency signals. Large impedances may be built into the current sources to dampen the noise; however, such impedances are impractical in low-power applications, such as smartphones, because large voltage supplies must be available to compensate for increases in impedance. Thus, such current source noise remains problematic, particularly in low-power applications.

BRIEF DESCRIPTION OF THE DRAWINGS

For a detailed description of various examples, reference will now be made to the accompanying drawings, in which:

FIG. 3 is a circuit schematic diagram of an illustrative current buffer system, in accordance with embodiments.

FIG. 4 is a circuit schematic diagram of another illustrative current buffer system, in accordance with embodiments.

DETAILED DESCRIPTION

At least some of the embodiments disclosed herein include complementary current sources comprising transistors—such as metal oxide semiconductor field effect transistors (MOSFETs)—that are configured in such a way that the noise current flowing through each of the current sources is approximately equal. Because the noise currents are approximately equal, they cancel each other or at least result in substantially dampened noise levels. At least some such embodiments include an alternating current (AC) coupling between the MOSFETs in each of the complementary current sources. Other embodiments include a direct current (DC) coupling between the MOSFETs in each of the complementary current sources. The precise configuration of the MOSFETs and AC and DC couplings are described in greater detail below with respect to the drawings. The various embodiments may be implemented in current buffers, digital-to-analog converters, and other types of current sources, and they may be applied in any of a variety of electronic systems.

Figure 1:
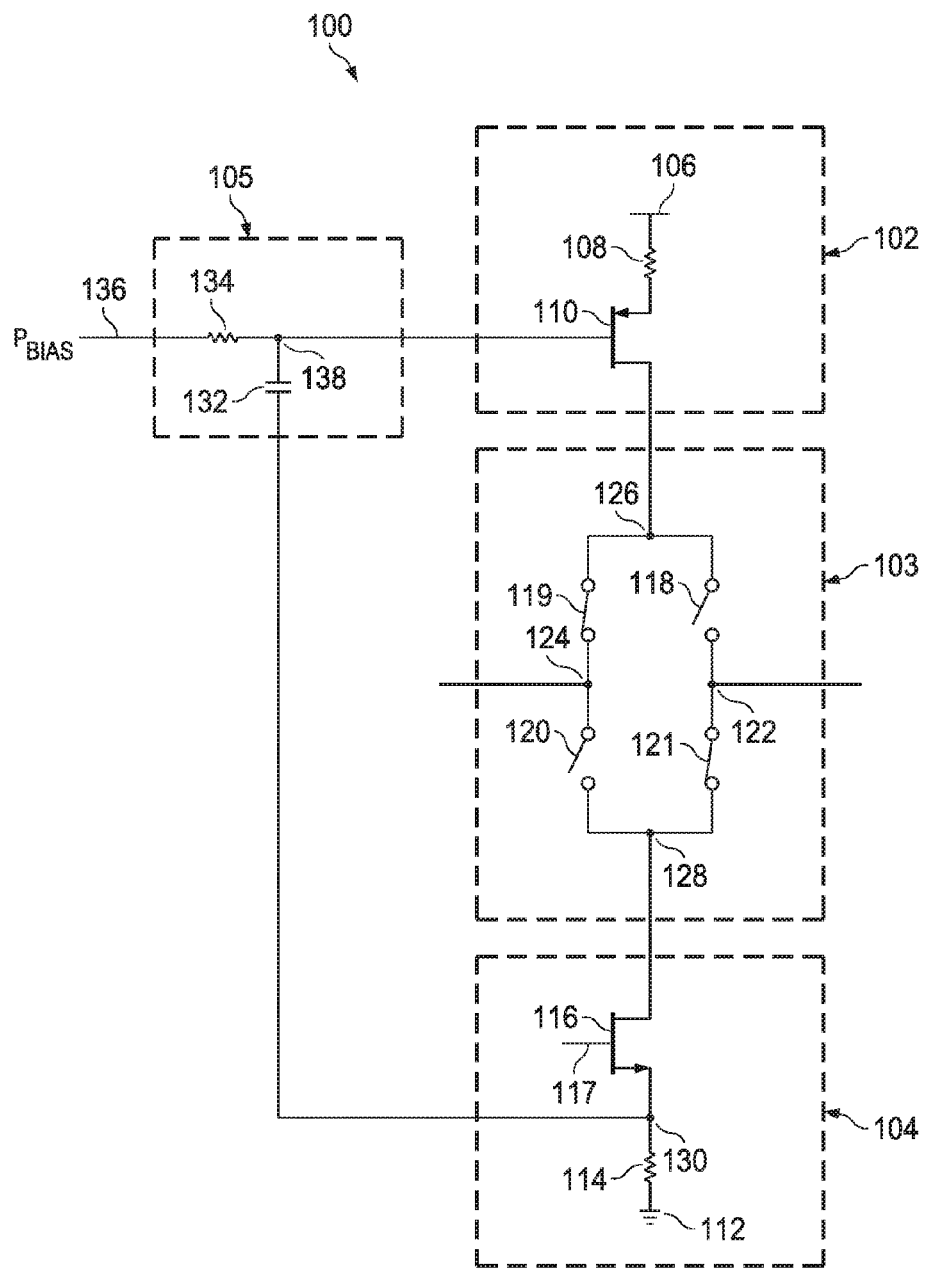
FIG. 1 is a circuit schematic diagram of an illustrative digital-to-analog converter current source (DAC), in accordance with embodiments.

FIG. 1 is a circuit schematic diagram of a digital-to-analog converter current source (DAC) 100. The DAC 100 comprises multiple current sources 102 and 104 and a differential switch network 103 positioned between the current sources 102 and 104. The current source 104 may be alternatively referred to as a current sink. The current source 102 may comprise a connection to a voltage supply rail 106, a resistor 108, and a transistor (e.g., a p-type metal oxide semiconductor field effect transistor (MOSFET)) 110. The drain of the MOSFET 110 couples to a node 126 in the differential switch network 103, which includes the nodes 126 and 128, switches 118-121, and current output nodes 122 and 124. The switches 118-121 may, for instance, be transistor switches, although the scope of disclosure is not limited as such. The node 128 couples to the current source 104, which may comprise a ground connection 112, a resistor 114, a node 130 coupled to the resistor 114, and a transistor (e.g., n-type MOSFET) 116, the source of which may couple to the resistor 114 via node 130, and the drain of which may couple to the node 128. The gate of the transistor 116 may be controlled via input signal 117, which is a bias signal that may be generated by any suitable component, such as a component external to the DAC 100. The current sources 102 and 104 couple to each other by way of an alternating current (AC) coupling 105, which may include a resistor 134 coupled to a capacitor 132 via a node 138. The node 138 may couple to the gate of the MOSFET 110 in the current source 102, and the capacitor 132 may couple to the node 130 in the current source 104. The resistor 134 receives an input bias signal $P_{BIAS}$, as indicated. The value of $P_{BIAS}$ may be set as desired to achieve the DAC 100 behavior described herein.

A goal of the operation of the circuit shown in FIG. 1 is to use the AC noise current flowing through the transistor 116 to produce a compensating AC noise current that flows in the opposite direction through the transistor 110. By ensuring that two currents of roughly equal magnitude flow in opposing directions (e.g., a current flowing in the direction from node 122 toward the transistor 116 and an opposing current flowing in the direction from node 124 to transistor 110), the AC noise is mitigated. In operation, an AC noise current $IN_{OUT}$ produced by the MOSFET 116 flows through the resistor 114. The $IN_{OUT}$ noise current flowing through the resistor 114 produces an AC voltage component across the resistor 114. This AC voltage component across the resistor 114 may be expressed as:

$$IN\_OUT \times R \qquad (1)$$

where $IN_{OUT}$ is the noise current flowing through the resistor 114, and R is the resistance of the resistor 114. With high frequency signals, the impedance of the capacitor 132 is substantially reduced and the capacitor 132 is thus effectively shorted, causing the nodes 130 and 138 to effectively become a common node with respect to AC voltages (e.g., relatively high frequency voltage components). Accordingly, the AC voltage component across the resistor 114 is applied to the gate of the MOSFET 110. Thus, the AC current flowing through the MOSFET 110 is regulated as a function of the noise current flowing through the resistor 114. Thus, the AC voltage component at the source of the MOSFET 110 may be expressed as:

$$K \times IN_{OUT} \times R \qquad (2)$$

where K is a predetermined factor, $IN_{OUT}$ is the noise current flowing through the resistor 114, and R is the resistance of the resistor 114. The factor K depends at least in part on the components selected for the DAC 100, such as the MOSFET 110, but in at least some embodiments, the factor K ranges from 0.8 amps/volt to 0.9 amps/volt. The switches 118-121 may be configured so that the current from one of the nodes 126, 128 flows to one of the nodes 122, 124 and the current from the other of the nodes 126, 128 flows to the other one of the nodes 122, 124. For instance, with switches 118 and 120 open and switches 119 and 121 closed, the current described in expression (2) may flow through the current output node 124, and the current described in expression (1) may flow through the current output node 122 (or current sink 104 may be said to sink current from output node 122 via node 128). Because the currents flowing through these current output nodes are nearly identical (except for the factor K), the noise components cancel each other out or at least substantially attenuate each other. The noise components cancel or at least attenuate each other because the noise components are AC signals that flow in opposing directions through the differential switch network 103—that is, the AC noise signal $IN_{OUT}$ flows from the node 122 toward the ground connection 112, and the offsetting AC noise signal K× $IN_{OUT}$ flows from the node 124 toward the supply rail 106. Thus, the two AC noise currents flow through their respective nodes and toward their respective rails. Different switch configurations—for instance, with switches 118 and 120 closed and switches 119 and 121 open—also may be used to achieve similar noise attenuation.

The scope of disclosure is not limited to the precise circuit schematic depicted in FIG. 1. In general, the scope of disclosure encompasses any circuit similar to that in FIG. 1 in which two current sources provide current to a differential switch network that outputs the currents in a differential manner, in which a first of the current sources contains noise current, and in which an AC coupling is positioned between the two current sources to regulate the current flow through a second of the current sources based on the noise current flowing through the first current source. Any and all circuit variations that achieve such functionality are contemplated and included within the scope of this disclosure.

Figure 2:
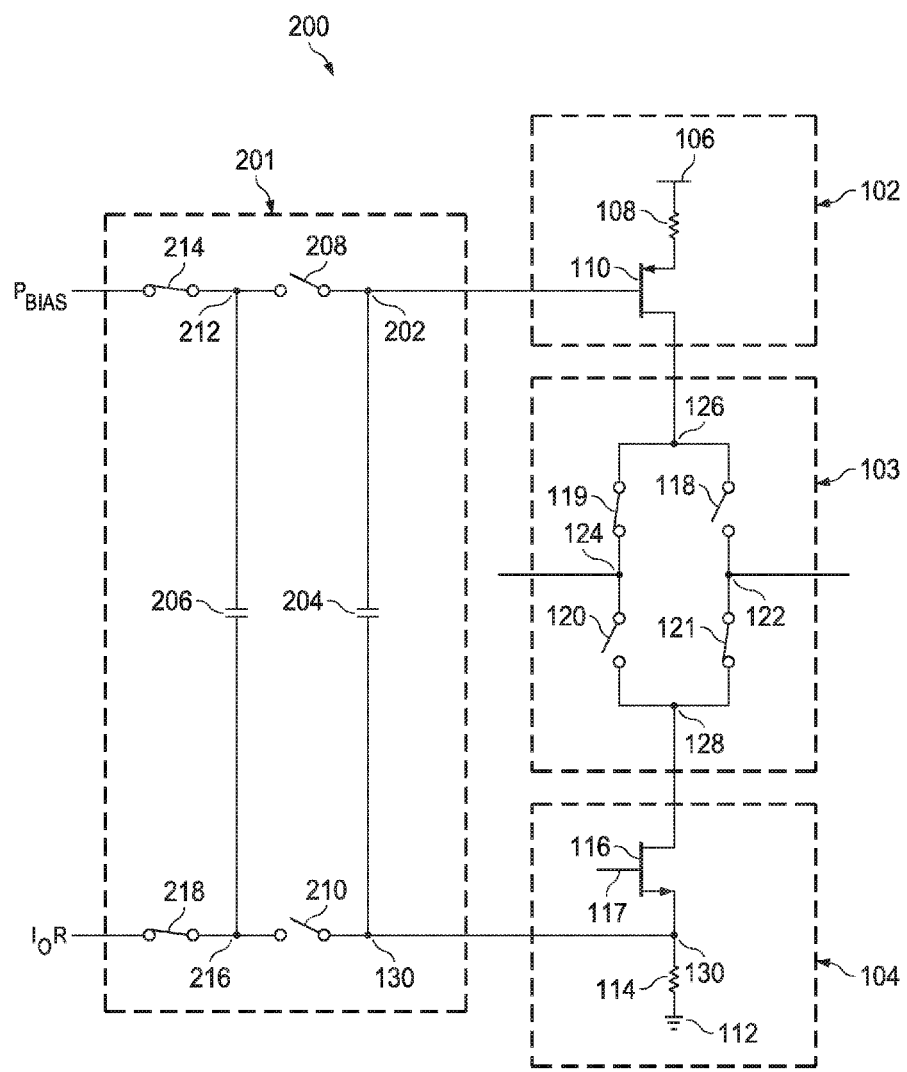
FIG. 2 is a circuit schematic diagram of another illustrative DAC, in accordance with embodiments.

As previously mentioned, the capacitor 132 behaves as a short when high frequency signals pass through the capacitor 132. Thus, the DAC 100 is well-suited to high-frequency applications or, at least, alternating current (AC) applications. When low-frequency signals (e.g., direct current (DC) signals) are applied to the capacitor 132, the capacitor 132 acts as an open connection. Accordingly, the DAC 200 depicted in FIG. 2 is better suited to low-frequency (e.g., DC) applications. The DAC 200 is similar to the DAC 100 in some respects. For instance, the DAC 200 comprises the current sources 102 and 104 as well as the differential switch network 103 positioned between the current sources 102 and 104. However, instead of the AC coupling 105 of FIG. 1, the DAC 200 includes a DC coupling 201. The DC coupling 201 includes a capacitor 204 that couples to the resistor 114 and the transistor 116 via the node 130. The capacitor 204 also couples to the transistor 110 via node 202. The capacitor 204 is configured to couple in parallel to another capacitor 206 via switches 208 and 210. In at least some embodiments, the switches 208 and 210 maintain the same state so that both of the switches are either simultaneously closed or simultaneously open. When the switches 208, 210 are closed, the capacitors 204, 206 couple in parallel, and when the switches 208, 210 are open, the capacitors 204 and 206 are fully disconnected from each other. The capacitor 206 couples to the switches 208, 210 via nodes 212, 216, respectively. The capacitor 206 also couples to switches 214, 218 via nodes 212, 216, respectively. A bias signal $P_{BIAS}$ is provided to switch 214, and a voltage signal $I_OR$ is provided to the switch 218. As with the $P_{BIAS}$ signal in FIG. 1, the potential between $P_{BIAS}$ and $I_OR$ in FIG. 2 is set as desired to achieve the DAC 200 functionality described herein.

In operation, a DC voltage is applied across the switches 214, 218. This voltage may be expressed as:

$$P_{BIAS}-I_OR \quad (3)$$

where $P_{BIAS}$ is the bias voltage applied at the switch 214 and $I_OR$ is the voltage applied at the switch 218. In a first stage of operation, the switches 214, 218 are closed and the switches 208, 210 are open, thus causing the capacitor 206 to be charged using the voltage expressed in (3). In a second stage, when the capacitor 206 is charged—or, after a predetermined amount of time—the switches 214, 218 are opened and the switches 208, 210 are closed, thus causing the capacitor 204 to be charged using the voltage applied at the nodes 202, 130 by the capacitor 206. Because the capacitors 204, 206 are coupled in parallel, the charge available in the two capacitors may be re-distributed among the two capacitors, and thus the capacitor 204 may not be fully charged. Accordingly, the first and second stages may be repeated multiple times until the capacitor 204 is fully charged, or at least until the capacitor 204 is charged to a predetermined extent.

As the capacitor 204 is charged, the charge stored in the capacitor 204 may be applied across the node 130 and the gate of the transistor 110. As previously explained, the voltage present at the node 130 (and across the resistor 114) may contain noise current information, since the noise current flowing through the resistor 114 produces the voltage across the resistor 114. The voltage at node 130 affects the potential applied to the gate of the transistor 110. Thus, if the AC current component through the resistor 114 is expressed as $IN_{OUT}$, and the AC component of the voltage across resistor 114 is expressed as $IN_{OUT} \times R$ (where R is the resistance of the resistor 114), the AC component of the voltage applied at the gate of the transistor 110 also may be expressed as $IN_{OUT} \times R$. The signals $P_{BIAS}$ and $I_OR$, as well as the capacitances of the capacitors 204 and 206, are selected to achieve application of the voltage across the resistor 114 at the gate of the transistor 110. As a result, the AC component of the current flowing through the resistor 108 may be expressed as $K \times IN_{OUT}$—that is, the same as the current flowing through resistor 114, but multiplied by a predetermined factor K. In at least some embodiments, the factor K is between 0.8 amps/volt and 0.9 amps/volt, although the scope of disclosure is not limited as such. As a result, the currents flowing in opposite directions through the output current nodes 122, 124 are nearly identical except for a factor K, resulting in the substantial or complete attenuation of noise current produced by one or more of the transistors in the DAC 200.

As explained above with respect to FIG. 1, the scope of disclosure is not limited to a DAC 200 that is identical to that depicted in FIG. 2. To the contrary, any DAC that includes a differential switch network positioned between two current sources and that further includes a DC coupling between the two current sources for the purpose of regulating current in one of the current sources based on a noise current present in the other current sources is contemplated and included within the scope of this disclosure.

FIG. 3 is a circuit schematic diagram of an illustrative current buffer system 300, in accordance with embodiments. The system 300 includes a current source 302 and a current source 304 (which may be alternatively referred to as a current sink 304). The current source 302 may include a voltage supply rail connection 306, a resistor 308 coupled to the rail connection 306, and an impedance (e.g., p-type MOSFET) 310, the source of which couples to the resistor 308. The current source 304 may include an impedance (e.g., n-type MOSFET) 312 coupled to a resistor 314 via node 324. The resistor 314, in turn, couples to a ground connection 316. The system 300 also comprises an impedance (e.g., n-type MOSFET) 318, the drain of which couples to the current source 302 via an output current node 320 and the source of which couples to the current source 304 via an input current node 322. The impedance provided by the impedance 318 may, in the case of a transistor, be controlled by the control signal 321. Similarly, the impedance provided by the impedance 312 may, in the case of a transistor, be controlled by the control signal 313. Control signals 321 and 313 may be bias signals that are generated by any suitable component, such as a component external to the system 300.

An AC coupling 305 couples the node 324 to the impedance 310 such that the AC voltage component present at node 324 controls the impedance provided by the impedance 310 (and, by extension, the current flowing through the impedance 310). In the case of a transistor, the impedance 310 has a gate that couples to the AC coupling 305. The AC coupling 305 may comprise a resistor 330, a capacitor 326, and a node 328 positioned therebetween. The AC coupling 305 may further comprise a −1 gain block 325 (e.g., an amplifier with a gain of −1) that inverts the polarity of a signal at node 324. The node 328 couples to the impedance 310, and the capacitor 326 couples to the node 324. When high frequency signals pass through the capacitor 326, the capacitor 326 is effectively shorted with respect to AC voltages (e.g., relatively high frequency voltage components), and the voltage present at the node 324 is also present at the impedance 310 (e.g., at the gate if a transistor is used as the impedance 310). If the AC current through the resistor 314 is expressed as $IN_{OUT}$, the AC voltage across the resistor 314 (at node 324) may be expressed as $IN_{OUT} \times R$. In some embodiments, the −1 gain block 325 inverts the polarity of the voltage at node 324. In other embodiments, a differential implementation may be used in lieu of the −1 gain block 325 such that the node 324 may be cross-connected to the impedance 310 of a duplicate system 300. More particularly, in such embodiments, two systems 300 are used, with the node 324 in each of the systems coupled to the AC coupling 305 of the other system and the node 320 of each system coupled to the node 320 of the other system. In either case, the AC voltage applied to the impedance 310 is the same as that present at the node 324, but with the polarity reversed. The AC voltage applied at the impedance 310 may be expressed as:

$$-IN\_OUT \times R \quad (4)$$

As a result, the AC voltage at the source of the MOSFET 310 may be expressed as:

$$K \times -(IN_{OUT} \times R) \quad (5)$$

where K is a predetermined factor that represents the difference between the currents flowing through the resistors 308 and 314. Thus, because the AC current flowing away from the output current node 320 and toward the impedance 312 is $IN_{OUT}$, and further because the AC current flowing toward the output current node 320 from the impedance 310 is $K \times IN_{OUT}$, the output AC current flowing out of node 320 is expressed as:

$$I_{OUT} = K \times IN\_OUT - IN\_OUT \quad (6)$$

which may alternatively be expressed as:

$$I_{OUT} = -IN\_OUT(1-K) \quad (7)$$

In this manner, the DAC 300 attenuates the noise generated internally by the impedances (e.g., transistors). The scope of disclosure is not limited to the precise circuit configuration shown in FIG. 3. Instead, the scope of disclosure encompasses any and all current buffer systems that include multiple current sources with a current buffer impedance (e.g., transistor) positioned therebetween and an AC coupling between the current sources, where the AC coupling regulates the current flowing through one of the current sources based on noise current in another one of the current sources.

FIG. 4 is a circuit schematic diagram of another illustrative current buffer system 400, in accordance with embodiments. The system 400 includes current sources 402 and 404. The current source 402 may include a voltage supply rail connection 406, a resistor 408 coupled to the rail connection 406, and an impedance (e.g., p-type MOSFET) 410. The current source 404 may comprise an impedance (e.g., n-type MOSFET) 412 coupled to a resistor 414, and the resistor 414 couples to a ground connection 416. An impedance (e.g., n-type MOSFET) 420 is positioned between the current sources 402, 404. The impedance of the impedance 420, in the case of a transistor, may be controlled by a control signal 419. Similarly, the impedance of the impedance 412, in the case of a transistor, may be controlled by control signal 413. Control signals 413 and 419 may be bias signals that are generated by any suitable component, such as a component external to the system 400. An output current node 418 is positioned between the impedances 410, 420. An input node 424 is positioned between the node 422 and the current source 404. The input node couples to an input branch that contains two resistors 426, 428, which, in at least some embodiments, are identical resistors. An input signal $V_{IN}$ is provided to the resistor 426. The node 422 couples to an AC coupling 405, which may comprise a resistor 432 coupled to a capacitor 430 via a node 434, as well as a −1 gain block 431 (e.g., an amplifier with a gain of −1). The node 434 couples to the impedance 410 (and, in the event of a MOSFET as the impedance 410, to the gate of the MOSFET), thus controlling the impedance of the impedance 410. The capacitor 430 couples to the node 422.

The AC current flowing through node 422 and toward node 424 may be expressed as $IN_{OUT}$, and the total (i.e., AC and DC combined) current flowing through the two resistors 426, 428 and toward the node 422 may be expressed as:

$$\frac{V_{IN}}{2R} \quad (8)$$

where R is the identical resistance of each of the resistors 426 and 428 and $V_{IN}$ is the voltage signal applied to the resistor 426. Accordingly, the total voltage present at the node 422 may be expressed as:

$$\frac{V_{IN}}{2gmR} + IN\_OUT \times 2R \quad (9)$$

where gm is the transconductance associated with the impedance 420. Similarly, the aforementioned currents result in the total current flowing through transistor 420 and toward the output current node 418, which may be expressed as:

$$\frac{V_{IN}}{2R} - \text{IN\_OUT} \qquad (10)$$

In some embodiments, the −1 gain block 431 inverts the polarity of the voltage at node 422. In other, differential embodiments, in lieu of the −1 gain block 431, the node 422 is cross-connected to the impedance 410 such that two systems 400 are used, with the node 422 of each system coupling to the AC coupling 405 of the other system and the nodes 418 of each system coupling to each other, thus causing the same voltage as that present at node 422 to be applied to the impedance 410, but with opposite polarity. In either case, in light of (9), the total voltage applied at the impedance 410 may be expressed as:

$$-(K1 V_{IN} + \text{IN}_{OUT} \times 2R) \qquad (11)$$

where $$K1 = \frac{1}{2gmR} \qquad (12)$$

As a result of the voltage applied at the impedance 410 (and, in the case that the impedance 410 is a MOSFET, at the gate of the MOSFET 410), the total voltage in between the impedance 410 and the resistor 408 may be expressed as:

$$-K(K1 V_{IN} + \text{IN}_{OUT} \times 2R) \qquad (13)$$

and the total current flowing through the impedance 410 may be expressed as:

$$\frac{K}{R1}(K1 V_{IN} + \text{IN}_{OUT} \times 2R) \qquad (14)$$

The current output of the system 400 via the output current node 418 is the difference between the currents in expressions (10) and (14). The current output from the system 400 thus substantially attenuates noise current present in the system 400 and generated by impedances (e.g., transistors) in the system 400. In addition, the system 400 provides an increased signal gain relative to systems lacking the novel features described and depicted herein.

The scope of this disclosure is not limited to the precise configuration shown in FIG. 4. To the contrary, the scope of disclosure encompasses any and all current buffer systems that include multiple current sources, a current buffer impedance (e.g., transistor) positioned between the current sources, and an AC coupling between the source of the current buffer impedance and one of the current sources for the purpose of regulating the current flowing through that current source based at least in part on the current flowing through the source of the current buffer impedance.

Figure 5:
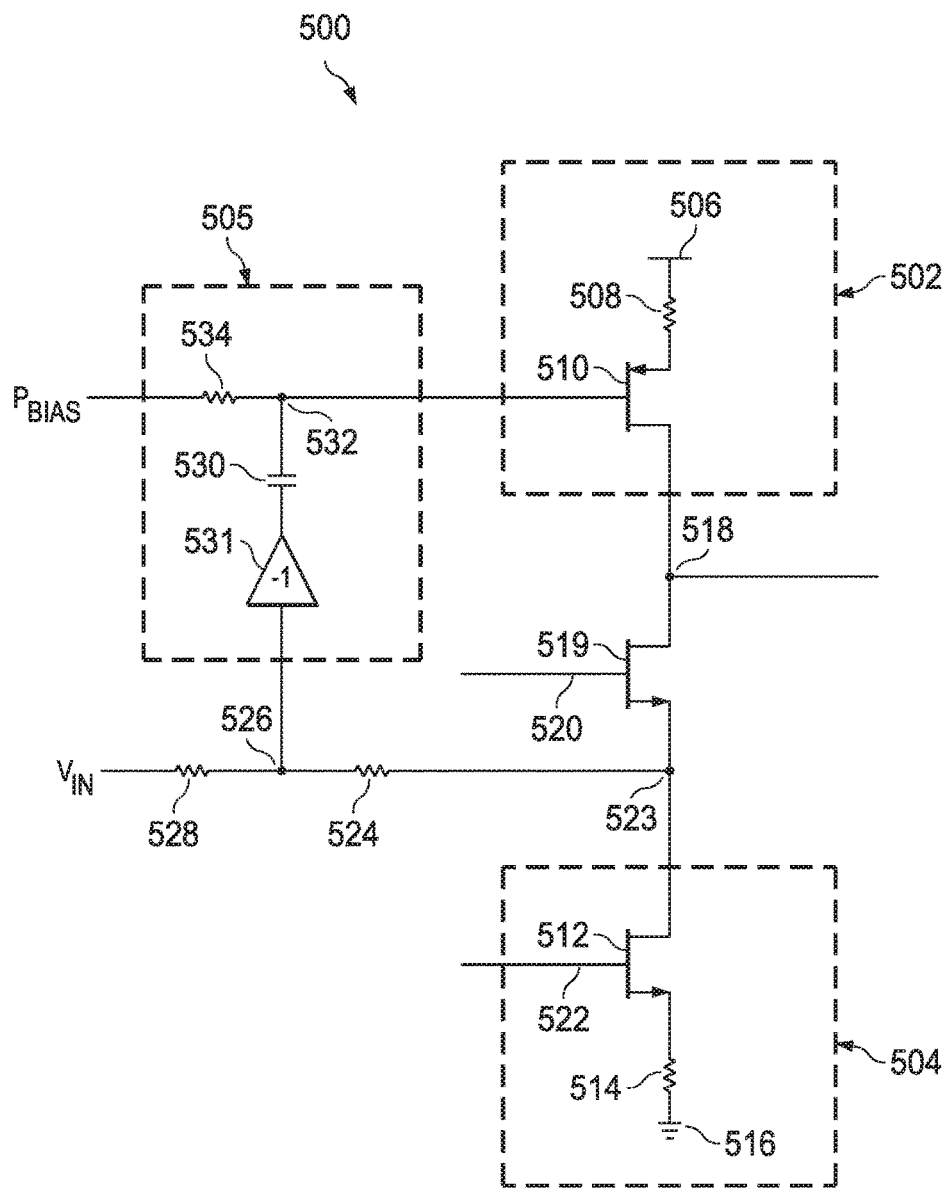
FIG. 5 is a circuit schematic diagram of yet another illustrative current buffer system, in accordance with embodiments.

FIG. 5 is a circuit schematic diagram of yet another illustrative current buffer system 500, in accordance with embodiments. The system 500 comprises current sources 502 and 504. The current source may include a voltage supply rail connection 506 coupled to a resistor 508, which, in turn, couples to an impedance (e.g., a p-type MOSFET) 510. The current source 504 may comprise an impedance (e.g., n-type MOSFET) 512 coupled to a resistor 514, which, in turn, couples to a ground connection 516. An impedance (e.g., n-type MOSFET) 519 is positioned between the current sources 502, 504. An output current node 518 may be positioned between the impedance 519 and the current source 502. The impedance of the impedance 519 may be controlled by a control signal 520 in the event that the impedance 519 is a transistor. Similarly, the impedance of the impedance 512 may be controlled by a control signal 522 in the event that the impedance 512 is a transistor. Control signals 520 and 522 may be bias signals generated by any suitable component, such as a component external to the system 500. An input signal node 523 is positioned between the impedance 519 and the current source 504, and the node 523 couples to an input branch that includes resistors 524, 528. In at least some embodiments, the resistances of the resistors 524, 528 are identical. An input signal $V_{IN}$ is provided to the resistor 528. A node 526 is positioned between the resistors 524, 528 that couples to an AC coupling 505. The AC coupling 505 may comprise a capacitor 530 that couples to the node 526. The capacitor 530 also couples to a resistor 534 via node 532. The AC coupling 505 may additionally comprise a −1 block 531 (e.g., an amplifier with a gain of −1). The node 532 couples to the impedance 510, and, in the event that the impedance 510 is a MOSFET, to the gate of the impedance 510. Accordingly, the signal at node 532 controls the impedance of the impedance 510. A bias signal $P_{BIAS}$ is provided to the resistor 534. As with the $P_{BIAS}$ signal in all embodiments described herein, the $P_{BIAS}$ signal in current buffer system 500 may be provided as desired so that the system 500 functions as described herein.

In operation, the DC current flowing through the input branch is expressed as:

$$\frac{V_{IN}}{2R} \qquad (15)$$

However, an AC noise current is introduced into the input branch via node 523, and it may be expressed as:

$$\frac{I_{NOISE}}{2} \qquad (16)$$

In view of these currents, the total voltage at the node 526 may be expressed as:

$$\frac{V_{IN}}{2} + I_{NOISE} \times \frac{R}{2} \qquad (17)$$

In some embodiments, the −1 gain block 531 causes the polarity of the voltage at node 526 to be reversed. In other embodiments, in lieu of the −1 gain block 531, the node 526 is cross-connected to the impedance 510 (and, in the event that the impedance 510 is a MOSFET, to the gate of the impedance 510). In such differential embodiments, two systems 500 may be used, with the nodes 523 of each system coupled to the node 526 of the other system, and the nodes 518 of each system coupled to each other. In either case, the voltage applied at the impedance 510 is the same as that in (17), but with opposite polarity. This results in a total voltage between the resistor 508 and the impedance 510 of:

$$-K \times \left(\frac{V_{IN}}{2} + I_{NOISE} \times \frac{R}{2}\right) \qquad (18)$$

Thus, the total current flowing through the impedance 510 toward the output current node 518 may be expressed as:

$$K \times \left( \frac{V_{IN}}{2R} + \frac{I_{NOISE}}{2} \right) \quad (19)$$

The total current flowing into the input branch via the node 523 may be expressed as:

$$\frac{V_{IN}}{2R} - \frac{I_{NOISE}}{2} \quad (20)$$

Thus, in view of the currents expressed in (19) and (20), the total current output by the system 500 via the output current node 518 may be expressed as:

$$\frac{V_{IN}}{2R}(1+K) - \frac{I_{NOISE}}{2}(1-K) \quad (21)$$

As with the embodiments described above, the system 500 attenuates noise produced by the current sources. In addition, the system 500 provides an increased signal gain relative to systems lacking the novel features described and depicted herein. Furthermore, the scope of disclosure is not limited to the precise configuration depicted in FIG. 5. To the contrary, the scope of disclosure encompasses any and all embodiments that include multiple current sources, a current buffer impedance (e.g., transistor) positioned between the current sources, and an AC coupling circuit between one of the current sources and an input branch that contains multiple resistors, where the AC coupling controls the flow of current through the current source to which it couples based on a signal in between the resistors of the input branch.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
a differential switch network comprising first and second output nodes;
first and second transistors coupled to the network;
a first resistor coupled to the first transistor and a second resistor coupled to the second transistor;
a voltage source coupled to the first resistor and a ground connection coupled to the second resistor; and
a capacitor coupled to the first and second transistors and to the second resistor;
further comprising a third resistor coupled to the capacitor and to the first transistor.

2. A system, comprising:
a differential switch network comprising first and second output nodes;
first and second transistors coupled to the network;
a first resistor coupled to the first transistor and a second resistor coupled to the second transistor;
a voltage source coupled to the first resistor and a ground connection coupled to the second resistor; and
a capacitor coupled to the first and second transistors and to the second resistor;
further comprising a second capacitor configured to switchably couple to the capacitor in parallel.

3. The system of claim 2, further comprising a zero frequency voltage applied across the second capacitor.

4. A system, comprising:
a differential switch network comprising first and second output nodes;
first and second transistors coupled to the network;
a first resistor coupled to the first transistor and a second resistor coupled to the second transistor;
a voltage source coupled to the first resistor and a ground connection coupled to the second resistor; and
a capacitor coupled to the first and second transistors and to the second resistor;
wherein the capacitor couples to a gate of the first transistor.

5. A system, comprising:
a differential switch network comprising first and second output nodes;
first and second transistors coupled to the network;
a first resistor coupled to the first transistor and a second resistor coupled to the second transistor;
a voltage source coupled to the first resistor and a ground connection coupled to the second resistor; and
a capacitor coupled to the first and second transistors and to the second resistor;
wherein the capacitor couples to a source of the second transistor.

6. A system, comprising:
a differential switch network comprising first and second output nodes;
first and second transistors coupled to the network;
a first resistor coupled to the first transistor and a second resistor coupled to the second transistor;
a voltage source coupled to the first resistor and a ground connection coupled to the second resistor; and
a capacitor coupled to the first and second transistors and to the second resistor;
wherein the differential switch network is configured to provide a first output current on the first output node and a second output current on the second output node, and wherein the first output current is proportional to the second output current by a predetermined factor K.

7. A system, comprising:
a plurality of impedances, each of the impedances coupled to another one of the impedances;
an output node positioned between a first and a second of the plurality of impedances;
an input node positioned between the second and a third of the plurality of impedances;
a resistor coupled to the first impedance;
a capacitor coupled to the first impedance and to the third impedance;
a fourth of the plurality of impedances coupled to the first impedance; and
a fifth of the plurality of impedances coupled to the third impedance.

8. The system of claim 7, wherein the third impedance comprises a metal oxide semiconductor field effect transistor (MOSFET), and wherein the capacitor couples to a source of the third impedance.

9. The system of claim 8, wherein the first impedance comprises another metal oxide semiconductor field effect transistor (MOSFET), and wherein the capacitor and the resistor couple to a gate of the first impedance.

10. The system of claim 7, wherein the second impedance comprises a metal oxide semiconductor field effect transistor (MOSFET), and wherein the capacitor couples to a source of the second impedance.

11. The system of claim 10, wherein the first impedance comprises another metal oxide semiconductor field effect transistor (MOSFET), and wherein the capacitor and the resistor couple to a gate of the first impedance.

12. The system of claim 7, wherein the input node couples to multiple resistors.

13. The system of claim 7, further comprising another plurality of impedances coupled in a serial configuration, at least two of the another plurality of impedances coupled to the capacitor.

14. A system, comprising:
a first current source comprising a first metal oxide semiconductor field effect transistor (MOSFET);
a second current source including a second MOSFET and coupled to the first current source via a current output node; and
a coupling circuit, positioned between the second MOSFET and the gate of the first MOSFET, that is configured to control current flow through the first MOSFET such that noise current flowing through the current output node is attenuated,
wherein the coupling circuit comprises either an alternating current (AC) coupling circuit or a direct current (DC) coupling circuit.

15. The system of claim 14, wherein the system is selected from the group consisting of a digital to analog converter (DAC) and a current buffer system.

16. The system of claim 14, wherein the coupling circuit couples to a drain or a source of the second MOSFET.

17. The system of claim 14, wherein the coupling circuit is configured to control current flow through the first MOSFET such that a first current flowing through the first MOSFET has a first noise component that is equivalent to a predetermined factor K multiplied by a second noise component of a second current flowing through the second MOSFET.

18. The system of claim 14, wherein the coupling circuit comprises a capacitor and a resistor coupled to the gate of the first MOSFET.

19. The system of claim 14, wherein the coupling circuit comprises a pair of capacitors coupled in parallel with each other and coupled to the gate of the first MOSFET.

* * * * *